United States Patent [19]

Cooper et al.

[11] Patent Number: 5,548,553
[45] Date of Patent: Aug. 20, 1996

[54] METHOD AND APPARATUS FOR PROVIDING HIGH-SPEED COLUMN REDUNDANCY

[75] Inventors: Elizabeth M. Cooper, Menlo Park; Michael Leary, San Jose, both of Calif.

[73] Assignee: Digital Equipment Corporation, Maynard, Mass.

[21] Appl. No.: 353,603

[22] Filed: Dec. 12, 1994

[51] Int. Cl.[6] .................................................. G11C 13/00
[52] U.S. Cl. ................ 365/200; 365/189.02; 365/230.02
[58] Field of Search .............................. 365/96, 200, 201, 365/230.02, 51, 189.02, 189.05, 230.06

[56] References Cited

U.S. PATENT DOCUMENTS 4,598,388  7/1986  Anderson ................................. 365/200
4,603,404  7/1986  Yamauchi et al. ....................... 365/200

Primary Examiner—Terrell W. Fears
Attorney, Agent, or Firm—Lindsay G. McGuinness; Denis G. Maloney; Arthur W. Fisher

[57] ABSTRACT

A semiconductor memory device according to the invention includes a main memory array comprising a plurality of memory sub-arrays. Each of the memory sub-arrays comprises a plurality of columns and at least one redundant column. Each column of the memory sub-array also includes multiplexing means, coupled to the input and output path of the respective column and an input and output path of a neighboring column. In addition, the redundant column is coupled to the input and output path of a neighboring column. In the event that one of the columns of the memory sub-array is defective, the multiplexing means of each of the columns between the defective column and the redundant column acts to couple the input and output paths of that column to the input and output paths of the neighboring column. With such an arrangement, the defective column is bypassed and a memory device capable of operating without defects is provided.

10 Claims, 3 Drawing Sheets

METHOD AND APPARATUS FOR PROVIDING HIGH-SPEED COLUMN REDUNDANCY

BACKGROUND OF THE INVENTION

This invention relates in general to semiconductor memory devices, and more particularly to semiconductor memory devices including redundant cells for replacing faults within the memory device.

As it is known in the art, during the fabrication of semiconductor memory devices it is possible for a memory device to include defects that will prevent the device from operating properly. These possible defects include short circuits between adjacent columns or rows or open circuits within individual columns or rows of the memory device, as well as non-functional clusters of cells.

These types of defects may be easily identified by a testing procedure after fabrication. A semiconductor memory device with a defect is inoperable, and would have to be discarded. Generally, however, the semiconductor memory devices have been designed to include a redundancy circuit having a number of redundant cells to replace the defective memory cells.

Typically two types of redundancy have been provided. One type is row redundancy. In memory devices which provide row redundancy, the memory device is apportioned into a discrete number of blocks. For each block, an extra set of rows are provided. If, during testing, it is discovered that a row or two adjacent rows or a cluster of cells within the pitch of a pair of rows in a block is defective, the redundant set for the block is substituted for the defective cells. To activate the redundant circuitry, appropriate fuses are included for programming individual decoder circuits to be responsive to the addresses of the defective set of rows.

There are a number of drawbacks associated with providing row redundancy. The first drawback is that it is ineffective against bit-line failures, that is when an entire column of the semiconductor memory device fails. The second drawback is that although at least a pair of rows is often provided as the redundant set for the block, that set may be ineffective to provide sufficient replacement capability for large clustered defects.

A second type of redundancy is to provide redundant columns in the semiconductor memory device. Depending on the width of the memory device, usually at least a pair of redundant columns is allocated to a predetermined number of columns. For example, a memory array having a 64 bit data path may provide a redundant column pair for each byte of information, thereby providing 8 redundant column pairs. Although column redundancy provides a technique for replacing bit-line failures, the available methods of providing column redundancy are complex and therefore do not make optimal use of the available semiconductor area. An additional problem associated with redundant column design is the increased propagation delay through the semiconductor device caused by the additional redundant logic. Thus, for memory devices in which the redundant column logic is utilized, because the timing of the device is adversely impacted the device may have to be sold at a discount even though it is utilizing more expensive hardware.

It would be desirable to provide a technique for providing redundancy in the semi-conductor device without adversely affecting the propagation delay or area constraints of the semi-conductor device.

SUMMARY OF THE INVENTION

In accordance with the present invention, a method for correcting errors in a memory device includes the steps of providing at least one redundant column in a memory array having a plurality of columns, the plurality of columns coupled to a bus having a corresponding plurality of bit locations, each of the columns having an input path and an output path, the input and output paths coupled to the corresponding bit location of the bus. The method further includes the step of bypassing one of said plurality of columns in the event that the one of said columns is defective, where the step of bypassing the one of the columns comprising the defect includes the step of coupling the bit locations of the bus corresponding to the columns between the defective column and the redundant column, including the bit location of said bus corresponding to the defective column, to the input and output path of the column adjacent to said corresponding column in the direction of the redundant column.

According to another aspect of the invention, an apparatus for correcting memory defects includes at least one redundant column of data and means, responsive to one of the columns of the memory being defective, for rearranging the correspondence between the bits on the bus and the columns of memory such that the redundant column stores data for one of the columns of the plurality of columns and another of said columns of the plurality of columns stores data for the defective column. With such an arrangement, a method and apparatus is provided for repairing defects in a semiconductor memory device with minimal added delay and complexity.

BRIEF DESCRIPTION OF THE DRAWINGS

The above-mentioned and other features of the invention will now become more apparent by reference to the following description taken in connection with the accompanying drawings in which.

DETAILED DESCRIPTION OF THE PREFERRED EMBODIMENT

Figure 1:
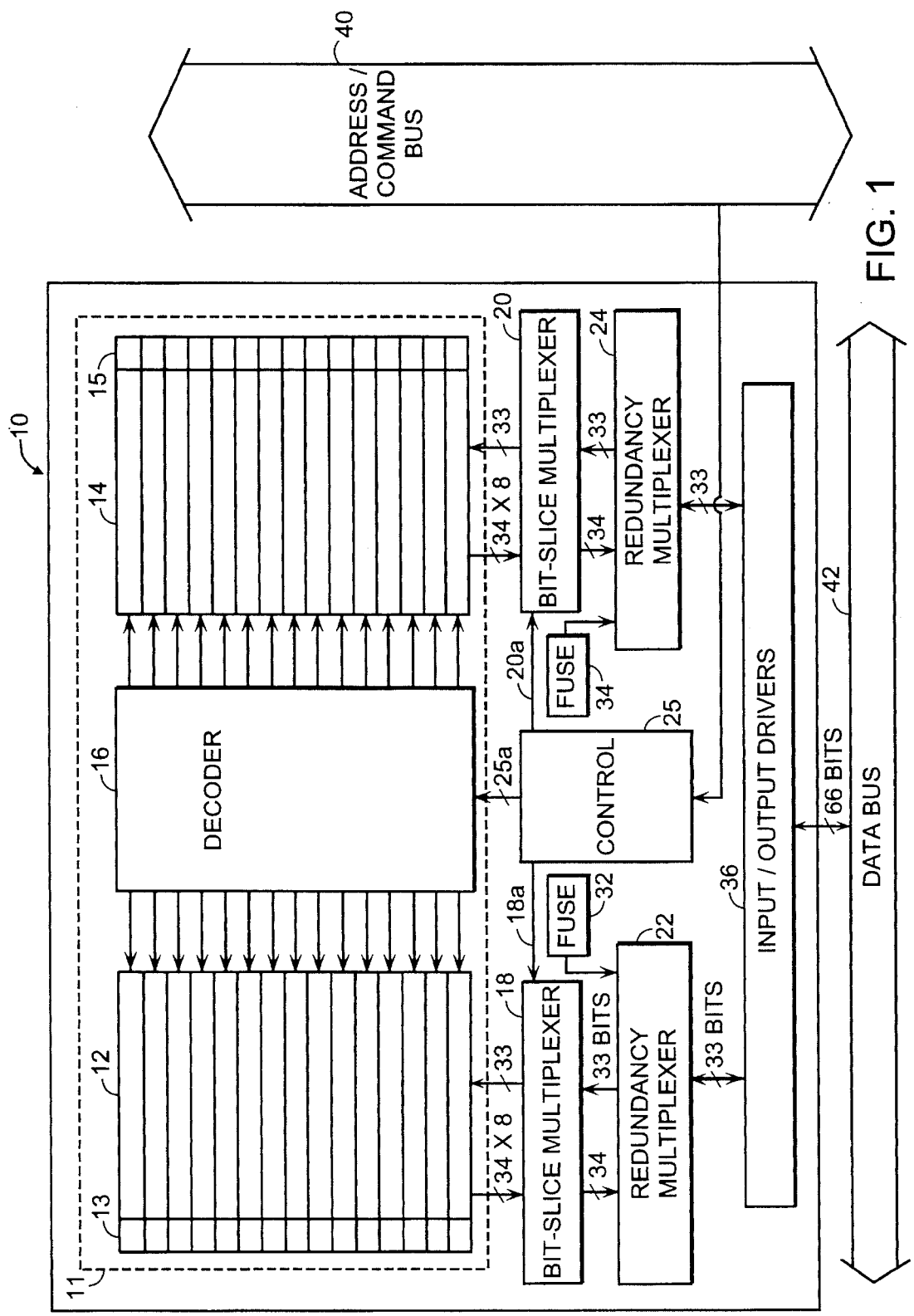
FIG. 1 is a block diagram of a semiconductor memory device including a redundant store according to the invention.

Referring now to FIG. 1, an illustrative 4K×8 bit semiconductor memory device 10 is shown to include a memory array 11 (shown by dashed lines in FIG. 1) which is physically divided into two 2K×8 sub-arrays 12 and 14. Each of the 2K sub-arrays 12 and 14 comprise 66 rows of 33 columns of 8-bit data. In addition, each of the 2K sub-arrays 12 and 14 includes redundant column store 13 and 15, respectively, for use in repairing bit-line failures as will be further described herein. Each redundant column store 13 and 15 comprises 66 rows by 1 8-bit column of redundant storage logic.

Sub-arrays 12 and 14, and redundant column stores 13 and 15 are coupled to receive index data from a word-line decoder 16. Word-line decoder 16 receives address data from control logic 25 via lines 25a. Control logic 25 is coupled to address/command bus 40.

In response to index data from word-line decoder 16, sub-arrays 12 and 14 provide 33 columns of 8 bit data to multiplexers 18 and 20, respectively. In addition, in response to the index data, redundant stores 13 and 15 each provide 1 column of 8 bit data to bit-slice multiplexers 18 and 20, respectively. The select inputs of multiplexers 18 and 20 are coupled to receive a decode of column address bits from control logic 25, to select one of the eight bits, or the desired 'bit slice', for output on the data bus 42.

Each of the bit-slice multiplexers 18 and 20 is coupled by a 34 bit bus to redundancy multiplexers 22 and 24, respectively. The 34 bit bus 18a and 20a, thus carries the selected bit slice for each of the 33 data columns from sub-arrays 12 and 14 as well as the bit-slice from the redundant columns 13 and 15 to the redundancy multiplexers. The select inputs of multiplexers 22 and 24 are coupled to fuses 32 and 34.

The multiplexers 22 and 24 are coupled to input/output driver 36. Input/output driver 36 includes a number of transceivers and sense amplifiers for receiving and transmitting data onto data bus 42.

During operation, control logic 25 receives an address and a command via bus 40. In response, the control logic 25 provides row address information to word-line decoder 16 to drive a row of data in the sub-arrays 12 and 14 and the redundant stores 13 and 15. During a read operation of semi-conductor device 10, when the word-line decoder selects the row of memory from sub-arrays 12 and 14 and redundant stores 13 and 15, 264 bits of data from each of the sub-arrays and 8 bits of data from each of the redundant data stores are input to each of the bit-slice multiplexers 18 and 20. In response to the column address provided on lines 18a and 20a, the appropriate bit slice is selected, and 34 bits of data are propagated to each of the redundancy multiplexers 22 and 24.

In response to the value stored in fuses 32 and 34, redundancy multiplexers 22 and 24 select 33 of the 34 bits provided from bit-slice multiplexers 18 and 20. As a result, sixty-six bits of data are driven by input/output buffers 36 onto data bus 42 for each memory access. The method for selecting which of the 34 bits are to be provided as output from each half of the memory array 11 is described in detail below.

Figure 2:
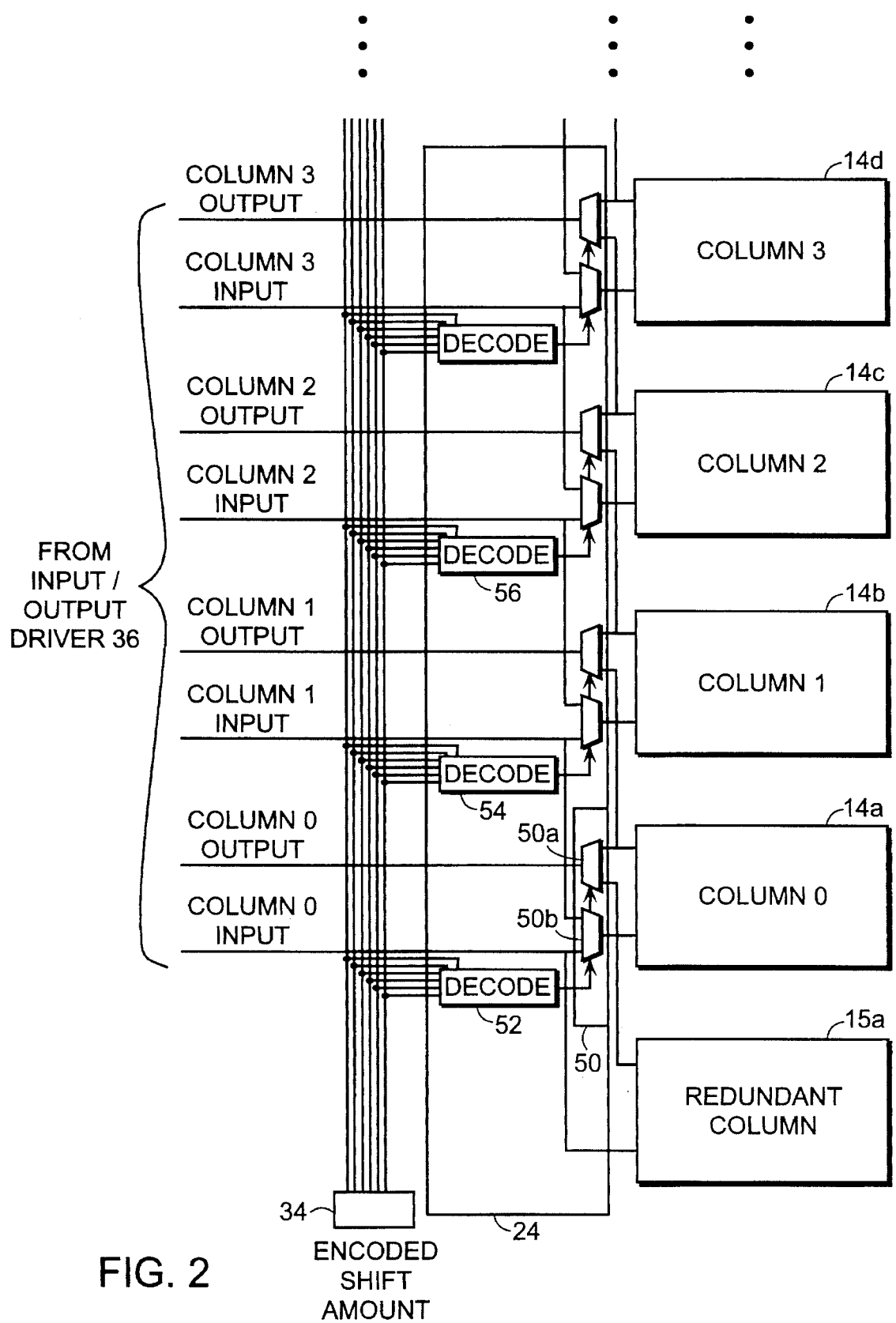
FIG. 2 is an exploded block diagram for use in illustrating the substitution of the redundant store in the semiconductor device of FIG. 1.

Referring now to FIG. 2, the redundancy multiplexers 22 and 24 operate in conjunction with the redundant stores 13 and 15, respectively, to repair defects in respective sub-arrays in the following manner. In FIG. 2, one half of memory device 10 is shown, incorporating outputs from the sub-array 14, outputs from the redundant storage 15, multiplexer logic 24, and fuses 34. The other half of the memory device, incorporating outputs of sub-array 12, multiplexer 18, fuses 32 and outputs of redundant store 13 operates substantially similar to the elements described in FIG. 2, and thus for ease of explanation will not be described in detail.

In FIG. 2, the elements 14a–14d represent the selected bit slice for four columns of sub-array 14. Element 15a represents the selected bit slice from the redundant store 15. Although the selected bit slice for all of the 33 columns of the sub-array has not been shown, it is to be understood that the connections shown with regard to the selected bit-slice of columns 0–3 are representative of the arrangement of the selected bit-slices of subsequent columns in the sub-array.

Multiplexer logic 24 is shown to include a pair of 2:1 multiplexers for each of the 33 columns of data in memory sub-array 14. Each multiplexer pair, for example multiplexer pair 50 (shown outlined) for column 0 data, includes an output multiplexer 50a and an input multiplexer 50b.

The input multiplexer 50b is coupled to input/output driver 36 (FIG. 1) for receiving column 0 data from bus 42 during a write operation of the memory device. Column 0 data is also used as an input for the selected bit-slice of redundant store 15. Input multiplexer 50b receives as its second input the bit data from the input/output drivers corresponding to the next physically adjacent column in memory. Here column 0 is shown to receive data from the column 1 input bit of the data bus 42. Assuming that the input multiplexer 50a was enabled to select the column 1 input bit for storage in the column 0 store 14a, in effect the data stored in memory sub-array 14 has been shifted to the right relative to the location of the data bit on data bus 42.

The output multiplexer 50a is coupled to transmit data to the input/output driver 36, to provide data to the column 0 location of data bus 42. The output multiplexer 50a receives as inputs data from column 0 of sub-array 14, and data from redundant store 15. Data from each column is also provided to the output multiplexer of the next physically adjacent column of memory. Here, data from column 0 of sub-array 14 is also provided as a potential source of column 1 output data.

Although the column arrangement of FIG. 2 facilitates a right shift of data for reads and writes, it should be understood that the objects of the invention are independent of the direction in which data is shifted between memory locations. If, for example, the redundant column was located adjacent to column 32, rather than column 0, (as shown with reference to sub-array 12 in FIG. 1) the direction of the shifts for read and write operations would be a left shift. It is the ability to perform the data shift, rather than the direction of the shift, which enables fast access of redundant store information for repairing defective memory locations, and example of which is described below.

The select values of the multiplexer pair 50 are provided by an associated decoder, for example decoder 52. The decoder 52 receives an encoded shift amount from fuses 32. The encoded shift amount comprises 6 bits (to encompass values from 0 to 33) and represents the number of columns that must shift their data in order to bypass the redundant column. To bypass the defective column, the correspondence between the bit number on the bus and the column number in sub-array is rearranged, or shifted, by one in the direction of the redundant column.

Figure 3:
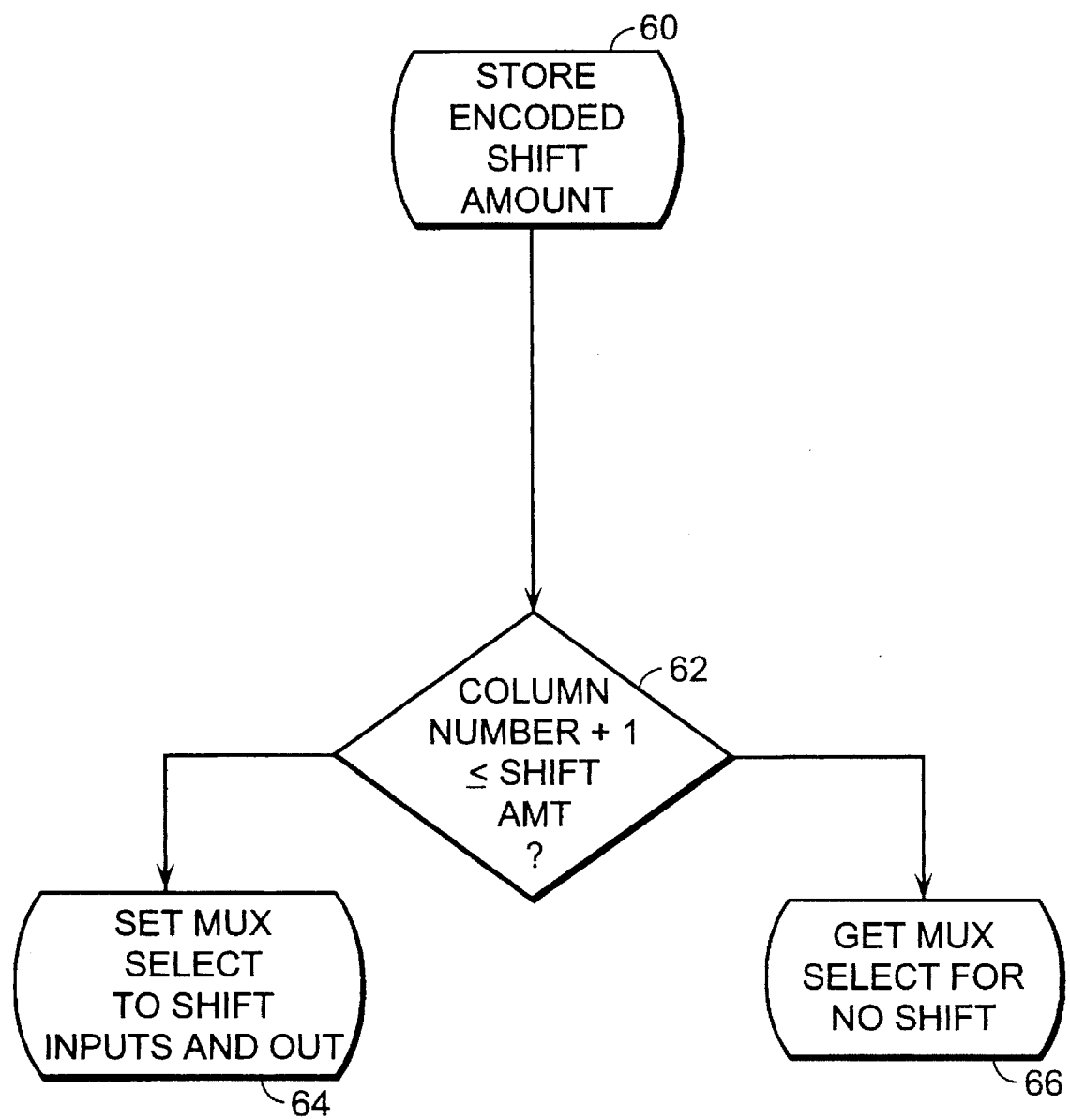
FIG. 3 is a flow diagram illustrating a method for controlling the substitution of the redundant store of FIG. 2.

For example, referring now to FIG. 3, during the testing of the semi-conductor device, a bit-line failure may be discovered in column 2 (14c of FIG. 2) of the device. At step 60 the encoded shift amount is stored in fuses 34. For the purposes of this example, the encoded shift amount would be a '3', indicating that data in the third column (column 0 inclusive) must be bypassed. At step 62, each decoder compares the encoded shift amount against its column address +1. For example, the decode logic of column 0, decoder 52, compares the received shift amount against the value '1' (column 0+1). If the encoded shift value is less than or equal to the column address +1, at step 64 the corresponding decoder provides a select value to enable the shifting of data between columns. Otherwise, at step 66, the corresponding decoder drives the select line of the multiplexer pair 50 so that data is sourced from the associated column.

It should be noted that the encoded shift amount could also be provided in the form of a binary mask having a number of bits equal to the number of columns, and with each bit indicating whether or not the multiplexer should shift its inputs and outputs. The decision as to whether or not to encode the shift amount is a matter of design depending on the number of columns and the available area. Here, given a sub-array with 33 columns, the routing of a 33 bit mask through the memory device is less desirable than encoding the mask into 6 bits and later decoding to determine the select. In addition, it should be noted that other methods of storing a shift amount or a mask may be used in addition to the use of fuse 34. For example, internal control registers that get initiated at power up by built in self test logic could also be used.

Thus with a value of 3 for the encoded shift amount, it can be seen, referring again to FIG. 2, that the input and output of columns 2–0 are sourced from the column of adjacent to the right. The input and output of column 2 are connected column 1, the input and output of column 1 are connected to column 0, and the input and output of column 0 are connected to the redundant column. The input and output of columns 3–31 would be sourced directly from the column itself.

The above described mechanism may be used to bypass a defect in any of the 33 columns. Thus, given M columns, where the Nth column is defective, and the redundant column is adjacent to column 0, the rearranging of storage of column bits can be achieved using the following formula:
Equation I:

Bits M–(N+1) are stored in columns M–(N+1), respectively;

Bits N–1 are stored in columns (N–1)–0, respectively; and

Bit 0 is stored in R, the redundant column.

Given that the redundant column is located adjacent to column M, and column N is the defective column, the bits are reallocated in the following manner:
Equation II:

Bit M is stored in R;

Bits (M–1)→N are stored in columns M→N+1, respectively; and

Bits (N–1)→0 are stored in columns (N–1)→0; respectively.

Thus it can be seen that the total delay added to the propagation delay in adding redundant column is the minimal propagation delay of a 2:1 multiplexer, no matter which of the columns includes the defective bit. In addition, the same delay is seen by all of the bits of the memory device, thus ensuring that all of the bits of the memory are provided substantially simultaneously.

It should be noted that although fuse 34 (FIG. 1) stores an encoded shift amount for sub-array 14, fuse 32 may store a different encoded shift amount for sub-array 12. As a result, two discrete bit-line failures per memory device may be corrected per semi-conductor memory device with only a minimal increase to the propagation delay of the semiconductor device.

The above described configuration allows for a small number of redundant columns of memory to be added to a design while maintaining maximal coverage. By allowing different sub-arrays to be independently programmed to select different columns for redundant coverage, a flexibility is provided which aids in coverage of defects. In addition, the above described method may alleviate the problem of bit-line failures without the known propagation problems and complexities associated with previously developed column redundancy methods.

Having described a preferred embodiment of the invention, it will now become apparent to one of skill in the art that other embodiments incorporating its concepts may be used. It is felt, therefore, that this embodiment should not be limited to the disclosed embodiment, but rather should be limited only by the spirit and scope of the appended claims.

What we claim is:

1. A method for correcting at least one defect in a memory device comprising the steps of:

providing at least one redundant column in a memory array having a plurality of columns, said plurality of columns coupled to a bus having a corresponding plurality of bit locations, each of said columns having an input path and an output path, wherein said output path further comprises a plurality of 2-input multiplexers corresponding to said plurality of bit locations, said input and output paths coupled to said corresponding bit location of said bus; and rearranging the correspondence between said bits on said bus and columns of memory in response to one of said plurality of columns being defective, such that the redundant column stores data for one of said columns of said plurality of columns and another of said columns of said plurality of columns stores data for said defective column, said step of rearranging comprising the step of coupling neighboring pairs of said columns to the inputs of said plurality of 2-input multiplexers, including coupling said redundant column to the input of one said plurality of 2-input multiplexers, and wherein the output of said multiplexer provides output from either one of said pair of columns to said bus.

2. A method for correcting at least one defect in a memory device comprising the steps of:

providing at least one redundant column in a memory array having a plurality of columns, said plurality of columns coupled to a bus having a corresponding plurality of bit locations, each of said columns having an input path and an output path, said input and output paths coupled to said corresponding bit location of said bus; and bypassing one of said plurality of columns in the event that said one of said columns is defective, said step of bypassing said one of said columns comprising the step of coupling said bit locations of said bus corresponding to said columns between said defective column and said redundant column, including said bit location of said bus corresponding to said defective column, to said input and output path of said column adjacent to said corresponding column in the direction of the redundant column said step of bypassing further comprising the step of coupling neighboring pairs of said columns to the inputs of a plurality of 2-input multiplexers, including coupling said redundant column to the input of one said plurality of 2-input multiplexers, and wherein the output of said multiplexer provides output from either one of said pair of columns to said bus.

3. A memory device comprising:

a memory array comprising a plurality of columns of data each of said columns having an input and an output path, said input and output paths coupled to a bus, said bus comprising a plurality of locations corresponding to said plurality of columns;

at least one redundant column of data, said redundant column of data accessed substantially simultaneously with said memory array; and means, responsive to one of said columns of said memory being defective, for rearranging the correspondence between said bits on said bus and columns of memory to allow the redundant column to store data for one of said columns of said plurality of columns and to allow another of said columns of said plurality of columns to store data for said defective column, said means for rearranging further comprising a plurality of 2-input multiplexers corresponding to a number of bits of said bus, each of said multiplexers coupling neighboring pairs of said columns to provide one output bit on said output bus.

4. The memory device of claim 3, wherein each of said plurality of columns further comprises:

input multiplexing means, coupled to receive input from said location on a bus corresponding to said respective column and from a location on said bus associated with a neighboring column.

5. The memory device of claim 4, wherein said input multiplexing means operates to receive data from said bus location associated with said neighboring column and said output multiplexing means operates to receive data from said neighboring column responsive to one of said plurality of columns being defective.

6. The memory device of claim 3, wherein said portion of said columns includes a set of columns located between said defective column and said redundant column.

7. The memory device of claim 6, further comprising means for storing a value indicating the number of columns in said portion of said columns.

8. The memory device of claim 6, further comprising means for storing a mask indicating which of said columns of said plurality of columns is included in said portion of said columns.

9. The memory device of claim 7 wherein said value is stored in a fuse.

10. The memory device of claim 7, wherein said value is stored in a register.

* * * * *